US008782476B2

(12) United States Patent
Kim (10) Patent No.: US 8,782,476 B2
(45) Date of Patent: Jul. 15, 2014

(54) MEMORY AND TEST METHOD FOR MEMORY

(75) Inventor: Dae-Suk Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 258 days.

(21) Appl. No.: 13/338,591

(22) Filed: Dec. 28, 2011

(65) Prior Publication Data

US 2012/0272108 A1  Oct. 25, 2012

(30) Foreign Application Priority Data

Apr. 25, 2011  (KR) .................. 10-2011-0038571

(51) Int. Cl.
*G11C 29/00*  (2006.01)
*G11C 29/56*  (2006.01)
*G11C 29/48*  (2006.01)
*G11C 29/44*  (2006.01)
*G11C 29/50*  (2006.01)

(52) U.S. Cl.
CPC ............ *G11C 29/56* (2013.01); *G11C 29/48* (2013.01); *G11C 29/44* (2013.01); *G11C 29/50* (2013.01)
USPC ........................................ 714/718; 714/738

(58) Field of Classification Search
CPC ...................................................... G11C 29/56
USPC ................................................ 714/718, 738
See application file for complete search history.

(56) References Cited

U.S. PATENT DOCUMENTS

| 5,872,793 | A | * | 2/1999 | Attaway et al. | 714/726 |
|---|---|---|---|---|---|
| 6,058,056 | A | * | 5/2000 | Beffa et al. | 365/201 |
| 6,452,844 | B2 | * | 9/2002 | Koshikawa | 365/200 |
| 6,515,921 | B2 | * | 2/2003 | Koshikawa | 365/200 |
| 7,123,542 | B2 | * | 10/2006 | Fekih-Romdhane et al. | 365/236 |
| 7,225,373 | B1 | * | 5/2007 | Edwards et al. | 714/725 |
| 7,263,638 | B2 | * | 8/2007 | Hokenmaier | 714/719 |
| 7,562,269 | B2 | * | 7/2009 | Yoshida et al. | 714/719 |
| 7,814,381 | B2 | * | 10/2010 | Ozeki | 714/719 |
| 7,877,649 | B2 | * | 1/2011 | Kliewer et al. | 714/718 |
| 8,316,265 | B2 | * | 11/2012 | Guo et al. | 714/726 |

FOREIGN PATENT DOCUMENTS

| KR | 100780612 | 11/2007 |
|---|---|---|
| KR | 1020080079753 | 9/2008 |
| KR | 1020090012499 | 2/2009 |
| KR | 1020100003040 | 1/2010 |

OTHER PUBLICATIONS

Notice of Allowance issued by the Korean Intellectual Property Office on Feb. 8, 2013.
Office Action issued by the Korean Intellectual Property Office on Jul. 23, 2012.

* cited by examiner

*Primary Examiner* — Esaw Abraham
(74) *Attorney, Agent, or Firm* — IP & T Group LLP (57) ABSTRACT

A test method for a memory having first and second cell arrays, first compressed data obtained by compressing output data of the first cell array and output data of the second cell array is outputted. When the first compressed data represents that a fail exists, output data of one of the first and second cell arrays is locked as normal data, and second compressed data obtained by compressing the normal data and output data of the other of the first and second cell arrays is outputted.

11 Claims, 7 Drawing Sheets

MEMORY AND TEST METHOD FOR MEMORY

CROSS-REFERENCE TO RELATED APPLICATIONS

The present application claims priority of Korean Patent Application No. 10-2011-0038571, filed on Apr. 25, 2011, which is incorporated herein by reference in its entirety.

BACKGROUND

1. Field

Exemplary embodiments of the present invention relate to a memory and a test method for a memory.

2. Description of the Related Art

As memory devices are highly integrated, a test of memory devices is performed for a long period of time using high-priced test equipment to ensure the reliability of memory chips.

A compression test (or parallel test) that reduces testing time is used as a test for memory devices. Hereafter, the compression test will be described.

In a device test technique, performing a reliable test is important, but a high speed test may be performed for a few thousand of cells. Particularly, since the reduction in test time until products are released as well as a reduction in development time of memory devices has immediate influence on product cost, the reduction in test time serves as a very important issue in efficiency and competition between manufacturers.

In a memory device, when producing a memory chip and performing a test for each cell to decide whether cells of the memory chip pass or fail, the test time of the highly integrated memory device is long, and an increase in cost is caused.

Accordingly, the compression test is used to reduce the test time. In the compression test, the same data is written in a plurality of cells, and a read operation is subsequently performed using an exclusive OR gate or logic gate. If the same data is read in the plurality of cells, a test result is decided as '1,' i.e., pass. If another data is read in at least one of the plurality of cells, the test result is decided as '0,' i.e., memory cell that failed a test. Accordingly, the test time can be reduced.

In the parallel test, a read/write operation of data is performed by simultaneously activating a plurality of cell array regions included in the memory device. The data outputted from the plurality of cell array regions is converted into 'compressed data' through a compression process and subsequently outputted to a circuit outside of the memory device. Thus, the pass/fail of the memory device may be checked using the 'compressed data' outputted as described above.

In an embodiment where the compression test is performed, the test for the memory device may be quickly performed. However, when the memory device is decided as a memory cell that failed a test, which cell array has the fail among a plurality of cell arrays of the memory device cannot be checked.

An embodiment where data outputted in two or more cell arrays is compressed as '1-bit compressed data' will be described. When the value of the 'compressed value' is '0,' the compression test decides that a fail occurs in the two or more cell arrays. However, since the data outputted in the two or more cell arrays is compressed as the '1-bit compressed data,' the compression test cannot check which cell array has the fail from the two or more cell arrays.

SUMMARY

An embodiment of the present invention is directed to a test method for a memory that can check which cell array has a fail among a plurality of cell arrays when performing a compression test on the memory having the plurality of cell arrays.

In accordance with an embodiment of the present invention, a test method for a memory having first and second cell arrays includes outputting first compressed data obtained by compressing output data of the first cell array and output data of the second cell array, and locking output data of one of the first and second cell arrays as normal data and outputting second compressed data obtained by compressing the normal data and output data of the other of the first and second cell arrays, when the first compressed data represents that a fail exists.

In accordance with another embodiment of the present invention, a test method for a memory having a plurality of cell arrays includes outputting first compressed data obtained by compressing output data of the plurality of cell arrays, and locking output data of the other cell arrays except at least one cell array specified as a target cell array among the plurality of cell arrays as normal data and outputting second compressed data obtained by compressing the normal data and output data of the target cell array, when the first compressed data represents that a fail exists.

In accordance with still another embodiment of the present invention, a memory includes a plurality of cell arrays, a data compression unit configured to generate a compressed data by compressing output data of the plurality of cell arrays in a compression test, and a data locking unit configured to lock output data of the other cell arrays except at least one cell array specified as a target cell array among the plurality of cell arrays as normal data.

BRIEF DESCRIPTION OF THE DRAWINGS

FIG. 4 is a configuration diagram of a data locking unit of FIG. 3a.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiments, the non-activation of a signal represents a logic value of '0,' and the activation of a signal represents a logic value of '1.' However, the non-activation and activation of the signal may have logic values different to those described above.

Figure 1:
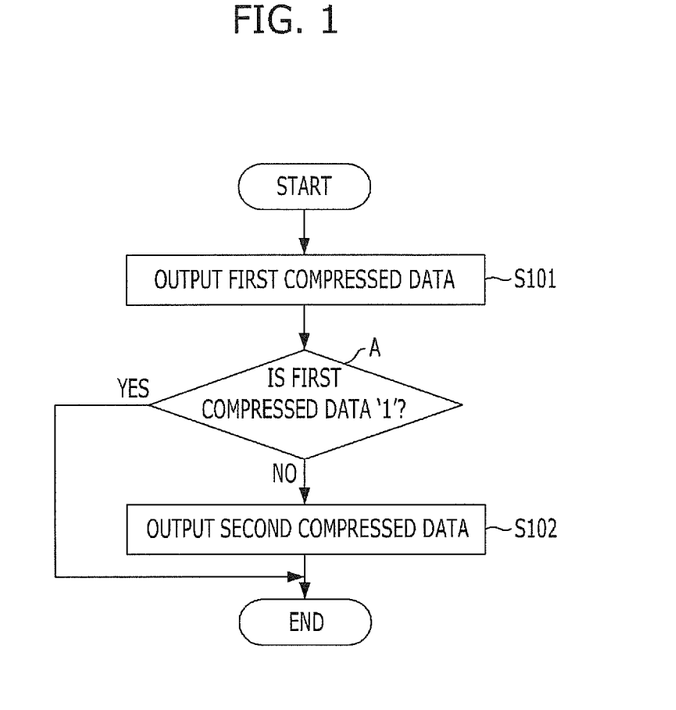
FIG. 1 is a flowchart illustrating a test method for a memory in accordance with an embodiment of the present invention.

FIG. 1 is a flowchart illustrating a test method for a memory in accordance with an embodiment of the present invention.

As illustrated in FIG. 1, the test method for a memory having first and second cell arrays includes outputting a first compressed data obtained by compressing output data of the first and second cell arrays (S101), and, when the first compressed data has a fail, locking the output data of one of the first and second cell arrays as normal data and outputting a second compressed data obtained by compressing the normal data and the output data of the other cell arrays (S102).

Here, the cell array refers to a set of memory cells including a plurality of memory cells arrayed in a matrix form. The cell array may correspond to a bank or may correspond to a partial region inside the bank.

Hereafter, the test method for the memory will be described with reference to FIG. 1.

If a compression test of the memory is started, data is outputted in the respective first and second cell arrays in response to a read command. When the compression test is performed, data, which all has the same value, is stored in the first and second cell arrays. Therefore, if the first and second cell arrays have no fail, the outputted data (hereinafter, referred to as output data) all have the same value (stored value).

The output data of the first and second cell arrays are compressed as a 'first compressed data' of 1 bit using an exclusive OR gate or another logic gate. The 'first compressed data' represents whether or not the values of the output data of the first and second cell arrays are all identical to each other. When the values of the output data of the first and second cell arrays are all the same, the value of the 'first compressed data' becomes '1.' Otherwise, the value of the 'first compressed data' becomes '0.' Hereinafter, the aforementioned case will be described.

If the first and second cell arrays have no fail, the output data of the first and second cell arrays all have the same value. Therefore, if the value of the 'first compressed data' is '1,' the 'first compressed data' represents that the first and second cell arrays have no fail. If the value of the 'first compressed data' is '0,' the 'first compressed data' represents that at least one of the first and second cell arrays has a fail.

First, a 'first compressed data' is outputted to decide whether or not the first and second cell arrays have a fail (hereinafter, referred to as a 'first compressed data output step' (S101)). The outputted 'first compressed data' is provided to test equipment, and the test of the memory proceeds to the next step depending on whether or not the first and second cell arrays have a fail.

When the 'first compressed data' outputted in the 'first compressed data output step' (S101) is '1,' the first and second cell arrays have no fail. Therefore, referring to FIG. 1, the test of the memory is ended along a path of 'Yes' from 'A.'

When the 'first compressed data' outputted in the 'first compressed data output step' (S101) is '0,' one or more of the first and second cell arrays has a fail. Therefore, the test of the memory performs a step to check which cell array has the fail (along a path of 'No' from 'A.').

In the step for detecting which cell array has a fail, the output data of one of the first and second cell arrays is locked as 'normal data,' and a 'second compressed data' obtained by compressing the 'normal data' and the output data of cell array is outputted (hereinafter, referred to as a 'second compressed data output step' (S102)). The 'normal data' used in the 'second compressed data output step' (S102) refers to data having the value of the output data of a current cell array when the cell array has no fail. More specifically, in the aforementioned example, the 'normal data' refers to data having the value '1.' The 'second compressed data' refers to compressed data obtained by locking one of the output data of the first and second cell arrays as a 'normal data' and compressing the 'normal data' and the output data of the other cell array.'

The 'second compressed data output step' (S102) is performed to detect which cell array has a fail. For example, the output data of the first cell array is assumed to be locked as a 'normal data,' and the 'second compressed data' obtained by compressing the 'normal data' together with the output data of the second cell array has a value of '0.' When the value of the 'second compressed data' is '0', the 'second compressed data' represents that one or more of the first and second cell arrays has a fail. However, since the output data of the first cell array is locked as the 'normal data,' the value of the 'second compressed data' cannot be '0' because of the fail occurring in the first cell array. In this example, the 'second compressed data' having a value of '0' represents that the second cell array has a fail.

The opposite example is the same. The output data of the second cell array is assumed to be locked as a 'normal data,' and the 'second compressed data' obtained by compressing the 'normal data' together with the output data of the first cell array has a value of '0.' However, the value of the 'second compressed data' cannot be '0' because of the fail occurring in the second cell array Therefore, the 'second compressed data' having a value of '0' represents that the first cell array has a fail.

After the output data of the first and second cell arrays respectively are locked as 'normal data,' the step of outputting the 'the second compressed data' is completed, the test of the memory is ended.

In the related art, data outputted in a plurality of cell arrays is compressed as a 1-bit compressed data in the compression test. Therefore, the compressed data may be identified that one or more of the plurality of cell arrays has a fail, but which cell array has the fail cannot be identified. However, in the present invention, output data of cell arrays except a specific cell array are locked as 'normal data' representing that all the cell arrays have no fail, and the compression test is performed. Thus, the presence of a fail in the plurality of cell arrays may be checked and even which cell array that has the fail may be checked.

Figure 2:
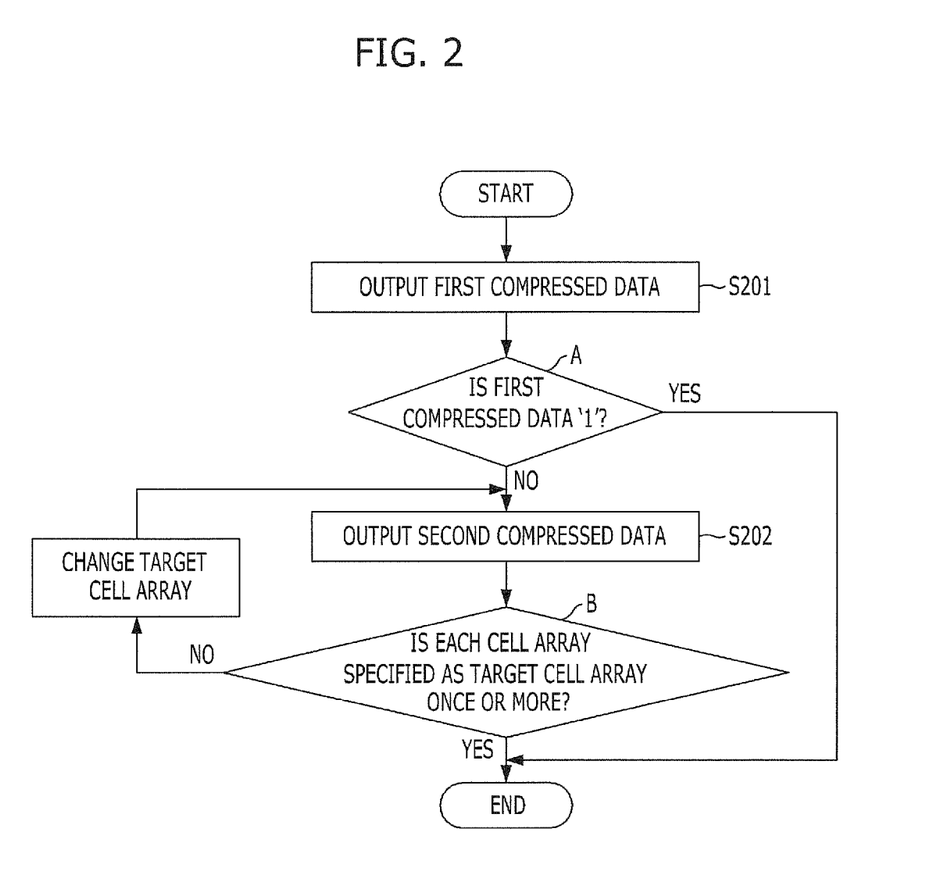
FIG. 2 is a flowchart illustrating a test method for a memory in accordance with another embodiment of the present invention.

FIG. 2 is a flowchart illustrating a test method for a memory in accordance with another embodiment of the present invention. The flowchart of FIG. 2 illustrates a test method of a memory, comprising a plurality of memory arrays.

As illustrated in FIG. 2, the test method for a memory having a plurality of cell arrays includes outputting a 'first compressed data' obtained by compressing output data of the plurality of cell arrays (S201), and, when the 'first compressed data' represents a fail, locking output data of other cell arrays except one or more cell arrays specified as a target cell array among the plurality of cell arrays as 'normal data' and outputting a 'second compressed data' obtained by compressing the 'normal data' and output data of the target cell array (S202).

Here, the meaning of the cell array is the same as described in FIG. 1. The 'first compressed data' of 1 bit and the 'second compressed data' of 1 bit are generated using an exclusive OR gate, another logic gate, or the like.

Hereinafter, the test method for the memory will be described with reference to FIG. 2.

If a compression test of the memory is started, data is outputted in the respective cell arrays in response to a read command. As described in FIG. 1, when the compression test is performed, data, which all has the same value, is stored in all the cell arrays. Therefore, if the plurality of cell arrays have no fail, output data of the plurality of cell arrays all have the same value.

The 'first compressed data' obtained by compressing the output data of the plurality of cell arrays represents that at least one of the plurality of cell arrays has a fail. Hereinafter, the plurality of cell arrays having no fail when the 'first compressed data' is '1,' and at least one of the plurality of cell arrays has a fail when the 'first compressed data' is '0' will be described.

First, 'first compressed data' obtained by compressing output data of a plurality of cell arrays is outputted to decide whether or not the plurality of cell arrays have a fail (hereinafter, referred to as a 'first compressed data output step' (S201)). The outputted 'first compressed data' is normally provided to test equipment, and the test of the memory proceeds to the next step depending on whether or not the plurality of cell arrays have a fail.

When the 'first compressed data' outputted in the 'first compressed data output step' (S201) is '1,' the plurality of cell arrays have no fail. Therefore, referring to FIG. 2, the test of the memory is ended along a path of 'Yes' from 'A.'

When the 'first compressed data' outputted in the 'first compressed data output step' (S201) is '0,' one or more of the plurality of cell arrays has a fail. Therefore, the test of the memory performs a step to check which cell array has the fail (along a path of 'No' from 'A.').

In the step for detecting a cell array having the fail, output data of the other cell arrays except at least one cell array (the number of cell arrays is 1 in the following description) specified as a target cell array among the plurality of cell arrays are locked as 'normal data,' and a 'second compressed data' obtained by compressing the 'normal data' and output data of the target cell array is outputted (hereinafter, referred to as a 'second compressed data output step' (S202)). Description of the 'normal data' is the same as described in FIG. 1. The 'second compressed data' refers to data obtained by locking output data of the other cell arrays except a target cell array among a plurality of cell arrays as 'normal data' and compressing the 'normal data' together with the output data of the other cell arrays.

The 'second compressed data output step' (S202) is performed to check which cell array has the fail, similarly to that described in FIG. 1. If the output data of the other cell arrays except the target cell array are locked as 'normal data,' the presence of a fail in the other cell arrays except the target cell array is reflected in the 'second compressed data.' Thus, the value of the 'second compressed data' reflects the presence of a fail of the target cell array.

To check all cell arrays having the fail, each of the plurality of cell arrays is specified as the target cell array once or more, and each of the plurality of cell arrays passes through the 'second compressed data output step' (S202) as the target cell array. As a result, when each of plurality of cell arrays is not specified as the target cell array once or more, the test of the memory proceeds along a path of 'No' from 'B' to change the target cell array (a cell array not specified as the target cell array until the current step is specified as the target array), and the 'second compressed data output step' (S202) is repeated.

When each of the plurality of cell arrays has been specified as the target cell array once or more in 'B,' the test of the memory proceeds along a path of 'Yes,' and the test is ended.

Meanwhile, the locking of the output data of the cell array as the 'normal data' means as follows. Multi-bit data is normally outputted in a cell array. 1-bit compressed data is generated by compressing multi-bit data respectively output in a plurality of cell arrays. The compressed data may be generated using a method of compressing a plurality of multi-bit data in one step or using a method of compressing multi-bit data as 1-bit intermediate data for each of the plurality of cell arrays and subsequently compressing the plurality of intermediate data.

The locking of the output data of the cell array as the 'normal data' means that the value of each bit of the multi-bit output data outputted in the cell array is locked as the 'normal data' and that 1-bit intermediate data, generated for each of the cell arrays, is locked as the 'normal data.' This is because the locking of each bit of the output data of the cell array as the 'normal data' has the same effect as the locking of the 1-bit intermediate data obtained by compressing the output data of the current cell array as the 'normal data.'

Unlike the related art, the present invention can check whether or not a fail exists in the plurality of cell arrays, and which cell array has the fail among the plurality of cell arrays.

Figure 3A:
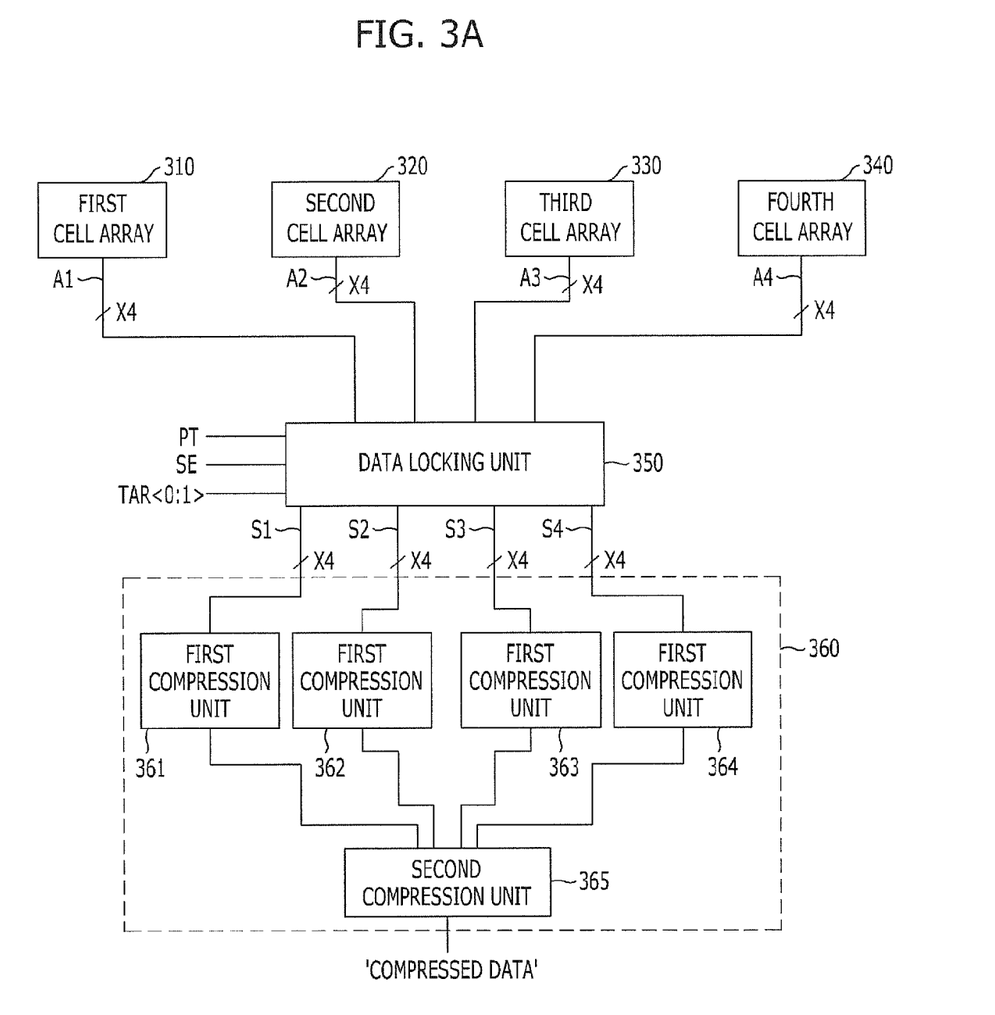
FIG. 3a is a configuration diagram of a memory in accordance with an embodiment of the present invention.
Figure 3B:
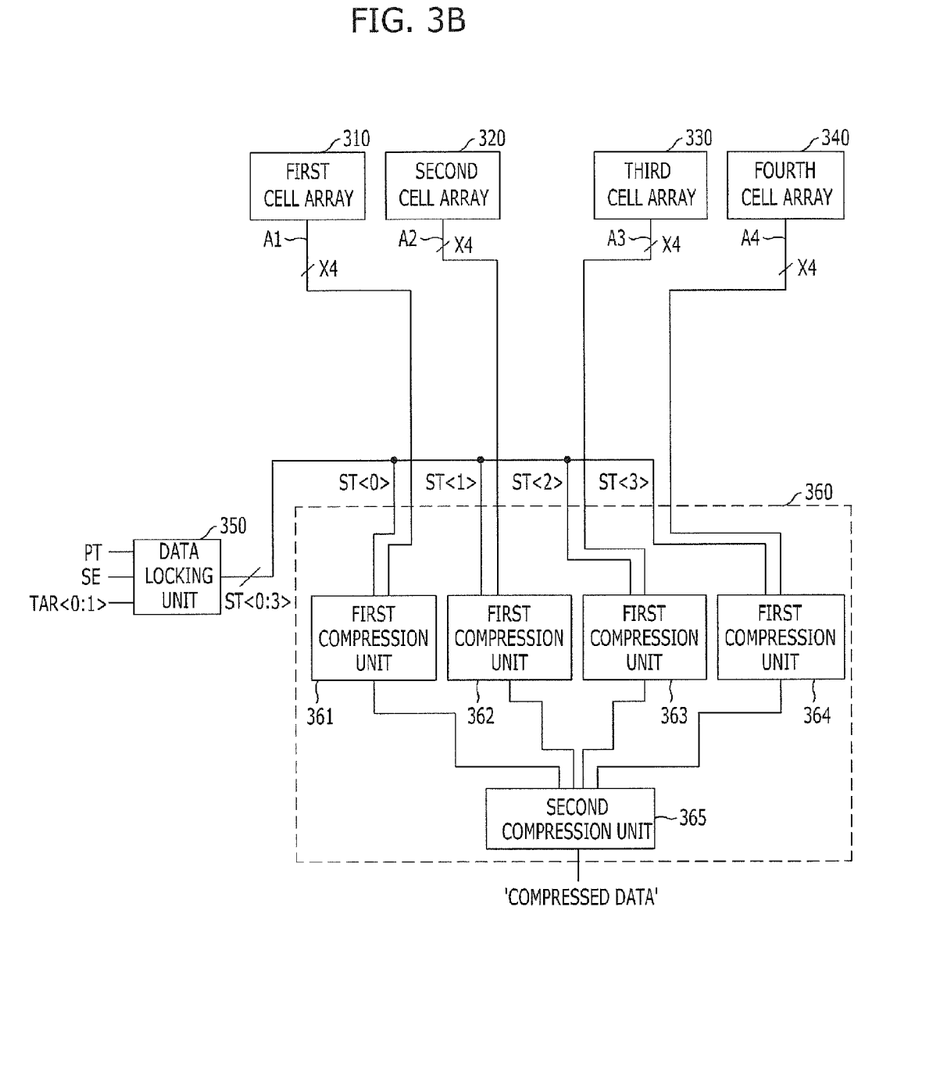
FIG. 3b is a configuration diagram of a memory in accordance with another embodiment of the present invention.

FIG. 3 illustrates memories in accordance with embodiments of the present invention. FIG. 3a illustrates a memory for locking bits of data, respectively outputted in cell arrays, as 'normal data.' In FIG. 3b illustrates a memory for locking intermediate data obtained by compressing output data of cell arrays as 'normal data.'

FIG. 3a is a configuration diagram of a memory in accordance with an embodiment of the present invention.

As illustrates in FIG. 3a, the memory includes a plurality of cell arrays 310 to 340, a data compression unit 360 for compressing output data of the plurality of cell arrays 310 to 340 and generating compressed data in a compression test, and a data locking unit 350 for locking, as 'normal data,' output data of other cell arrays except at least one cell array specified as a target cell array among the plurality of cell arrays 310 to 340. As an example, a memory having four cell arrays will be described. FIG. 3a illustrates that the value of each bit of output data of cell arrays is locked as 'normal data.'

Hereafter, an operation of the memory in accordance with the embodiment of the present invention will be described with reference to FIG. 3a.

A first test signal PT is a signal activated in the compression test, and a second test signal SE is a signal activated in a test for detecting a cell array having a fail in the compression test. A target information TAR<0:1> is information regarding which cell array among the plurality of cell arrays 310 to 340 is a target cell array. Hereafter, an operation of the memory when the first cell array 310 is a target cell array will be described. The 'compressed data' is data obtained by compressing output data of the plurality of cell arrays 310 to 340 as 1 bit. Particularly, the 'first compressed data' is data obtained by compressing the output data of the plurality of cell arrays 310 to 340 in the state where the target cell array is not specified, and the 'second compressed data' is data obtained by compressing the output data of the plurality of cell arrays 310 to 340 in the state where the target cell array is specified.

(1) When Performing Compression Test (Activation of First Test Signal Pt and Non-Activation of Second Test Signal SE)

When the first test signal PT is in an activation state and the compression test is not a compression test for checking a cell array having a fail, the second test signal SE is in a non-activation state. If a read command is applied to the memory, data is outputted (hereinafter, referred to as output data) in all the plurality of cells arrays 310 to 340 by a control unit (not shown in FIG. 3a) for controlling the plurality of cell arrays. As an example, four bits of output data (X4 denotes that the number of output data bits is four and the number of lines for transmitting the output data is four) are outputted. A1 to A4 denote four lines, and S1 to S4 denote four lines.

The output data of the cell arrays 310 to 340 is provided to the data locking unit 350 through the respective lines A1 to A4. When the compression test is performed in the data locking unit 350, output data of the lines A1 to A4 are respectively provided to the lines S1 to S4 regardless of the target information TAR<0:1>.

The output data of the plurality of cell arrays 310 to 340 provided to the compression unit 360 through the lines S1 to S4 are compressed as 1-bit intermediate data in first compression units 361 to 364, respectively. Subsequently, the four intermediate data are compressed as a 1-bit 'first compressed data' (the compression test is not a compression test for detecting a cell array having a fail, and therefore, the 'compressed data' is 'first compressed data') via a second compression unit 365. For reference, in the data compression unit 360, data is not necessarily compressed through the two steps described above. The configurations of the first compression units 361 to 364 and the second compression unit 365 may be identical to one another, and each of the compression units may be an exclusive NOR gate.

The 'first compressed data' is outputted to outside of the memory device through an interface pad (not shown in FIG. 3a) provided to the memory. If the 'first compressed data' represents that there is no fail ('1') in the state that a target cell array is not specified as described above, all the plurality of cell arrays 310 to 340 have no fail. If the 'first compressed data' represents that there is a fail ('0'), at least one of the plurality of cell arrays 310 to 340 has the fail.

(2) When Performing a Compression Test for Detecting which Cell Array has a Fail (Activation of First Test Signal PT and Activation of Second Test Signal SE)

As an example, an operation of the memory when the first cell array 310 is a target cell array will be described.

When the compression test for detecting which cell array has a fail is performed, the first test signal PT and the second test signal SE are activated. When a read command is applied to the memory, four bits of output data are outputted from all the plurality of cell arrays, respectively. The output data are provided to the data locking unit 350 through the respective lines A1 to A4. The data locking unit 350 provides the output data of the first cell array 310 specified as a target cell array by the target information TAR<0:1> to the line S1 in the lines A1, and locks the output data of the other cell arrays 320, 330 and 340 as normal data ('1' in FIG. 3) and then provides the locked output data to the lines S2 to S4. Thus, the values of data provided to the respective lines S2 to S4 all become '1,' which is the value of the normal data, regardless of the values of the output data provided to the respective lines A2 to A4.

In the data compression unit 360, the output data and the normal data are compressed as 'second compressed data' (the compression test is a compression test for detecting a cell array having a fail, and therefore, the 'compressed data' is 'second compressed data') through the same process described above. The 'second compressed data' is outputted to the outside of the memory device via the same path as the 'first compressed data.' When the 'second compressed data' represents that there is a fail in the state that one of the plurality of cell arrays 310 to 340 is specified as a target cell array 310, the target cell array 310 has the fail. On the contrary, when the 'second compressed data' represents that there is no fail in the state that one of the plurality of cell arrays 310 to 340 is specified as the target array 310, the target cell array 310 has no fail.

In another embodiment, one or more cell arrays may be specified. Since the present invention is related to the operation of the memory device in the compression test, the present invention is not directly related to a data output operation of the memory, and the data output operation is well known by a person skilled in the art. Therefore, its detailed description will be omitted.

Unlike the related art, the present invention can check whether or not a fail exists in the plurality of cell arrays, and which cell array has the fail among the plurality of cell arrays.

FIG. 3b is a configuration diagram of a memory in accordance with another embodiment of the present invention.

As illustrated in FIG. 3b, the memory includes a plurality of cell arrays 310 to 340, a data compression unit 360 for compressing output data of the plurality of cell arrays 310 to 340 and generating compressed data in a compression test, and a data locking unit 350 for locking, as 'normal data,' output data of the other cell arrays except at least one cell array specified as a target cell array among the plurality of cell arrays 310 to 340.

As an example, a memory having four cell arrays will be described. FIG. 3b illustrates that the value of 1-bit intermediated data (outputs of the compression units 361 to 364) obtained by compressing output data of the cell arrays is locked as 'normal data.'

Hereafter, an operation of the memory in accordance with the embodiment of the present invention will be described with reference to FIG. 3b.

The operation illustrates that four bits of (X4 denotes that the number of output data bits is four and the number of lines for transmitting the output data is four) output data are outputted from the plurality of cell arrays 310 to 340, and the operation of the data compression unit 360 are almost identical to those in the memory of FIG. 3a.

A plurality of locking signals ST<0> to ST<3> are signals for determining outputs of the first compression unit 361 to 364 corresponding to the respective locking signals ST<0> to ST<3>. More specifically, the plurality of locking signals ST<0> to ST<3> are signals for determining the value of intermediate data obtained by compressing the output data of the plurality of cell arrays 310 to 340. When the first test signal PT and the second test signal SE are activated, the data locking unit 350 activates the other locking signals except a locking signal corresponding to the target cell array among the plurality of locking signals ST<0> to ST<3> in response to target information TAR<0:3> (information on a target cell array). In other cases, the data locking unit does not activate all the locking signals ST<0> to ST<3> regardless of the target information TAR<0:3>.

The first compression units 361 to 364 respectively corresponding to the activated locking signals ST<0> to ST<3> lock the value of the intermediate data as 'normal data,' i.e., '1' in response to the activated locking signals ST<0> to ST<3>. The first compression units 361 to 364 respectively corresponding to the locking signals ST<0> to ST<3> generates intermediate data by compressing output data of the cell arrays 310 to 340, respectively corresponding to the locking signals ST<0> to ST<3>.

(1) When Performing a Compression Test (Activation of First Test Signal Pt and Non-Activation of Second Test Signal SE)

Output data provided to lines A1 to A4 is compressed as 1-bit intermediate data in the first compression units 361 to 364, respectively. Since the second test signal SE is in a non-activation state, all the locking signals ST<0> to ST<3> are in the non-activation state. Thus, the first compression units 361 to 364 output the compressed results of the data output from the plurality of cell arrays 310 to 340 as intermediate data.

The intermediate data is compressed as 'first compressed data' in the second compression unit 365. The relation between the value of the 'first compressed data' and the presence of fail of the plurality of cell arrays 310 to 340 is the same as described in FIG. 3a.

(2) When Performing Compression Test for Detecting which Cell Array has a Fail (Activation of First Test Signal PT and Activation of Second Test Signal SE)

As an example, an operation of the memory when the first cell array 310 is a target cell array will be described.

The output data provided to the A1 to A4 are compressed as 1-bit intermediate data (are outputs of the first compression units 361 to 364, and therefore, the number of the intermediate data is 4) in the first compression units 361 to 364, respectively. Since the target cell array 310 is specified by the target information TAR<0:1>, the other locking signals ST<1> to ST<3> except the first locking signal ST<0> are activated. Thus, the output of the first compression unit 361 corresponding to the first cell array 310 is a result obtained by compressing the output data of the first cell array 310, but the outputs of the other first compression units 362 to 364 become 'normal data,' i.e., '1.'

One intermediate data and three normal data are compressed as 'second compressed data' in the second compression unit 365. The relation between the value of the 'second compressed data' and the presence of fail of the plurality of cell arrays 310 to 340 is the same as described in FIG. 3b.

Figure 4:
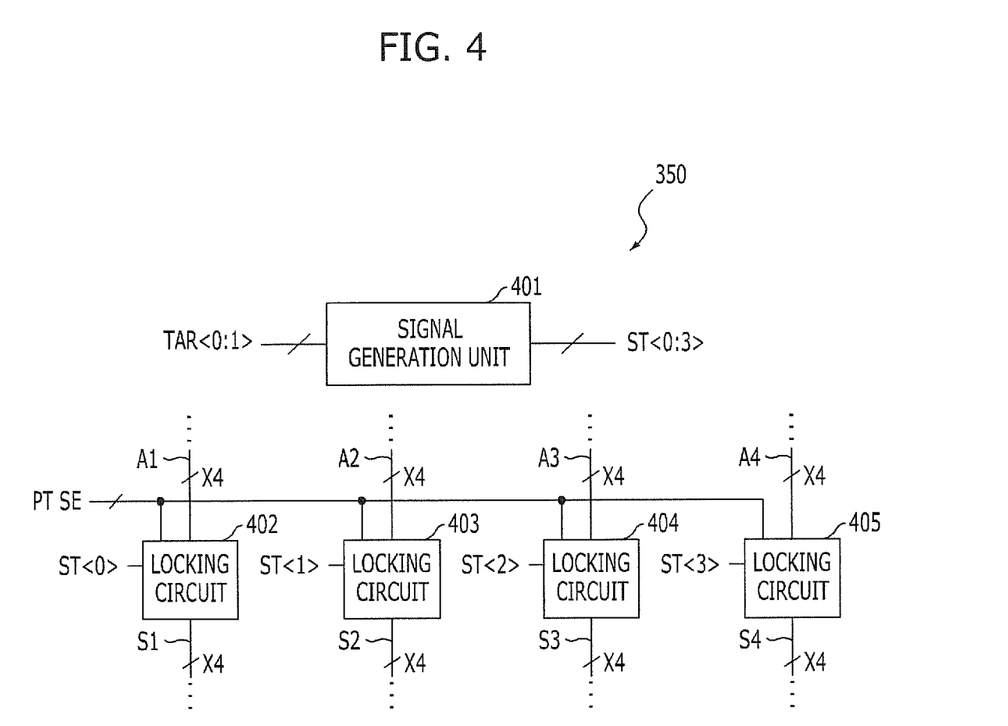

FIG. 4 is a configuration diagram of the data locking unit 350 of FIG. 3a.

As illustrated in FIG. 4, the data locking unit 350 includes a signal generation unit 401 and a plurality of locking circuits 402 to 405.

The signal generation unit 401 activates some of the locking signals ST<0> to ST<3> respectively corresponding cell arrays except a cell array specified as a target cell array among the plurality of cell arrays 310 to 340 in response to the target information TAR<0:1>. When the first test signal PT is activated and the second test signal SE is not activated, all the locking signals ST<0> to ST<3> are not activated.

When the first and second test signals PT and SE are all activated and the locking signals ST<0> to ST<3> corresponding to the respective locking circuits 402 to 405 are activated, each of the locking circuits 402 to 405 provides 'first data,' i.e., '1' to its own output line S1 to S4. When all the first and second test signals PT and SE are not activated or where the locking signals ST<0> to ST<3> respectively corresponding to the locking circuits 402 to 406 are not activated, each of the locking circuits 402 to 406 provides data of its own input line A1 to A4 to its own output line S1 to S4.

Figure 5:
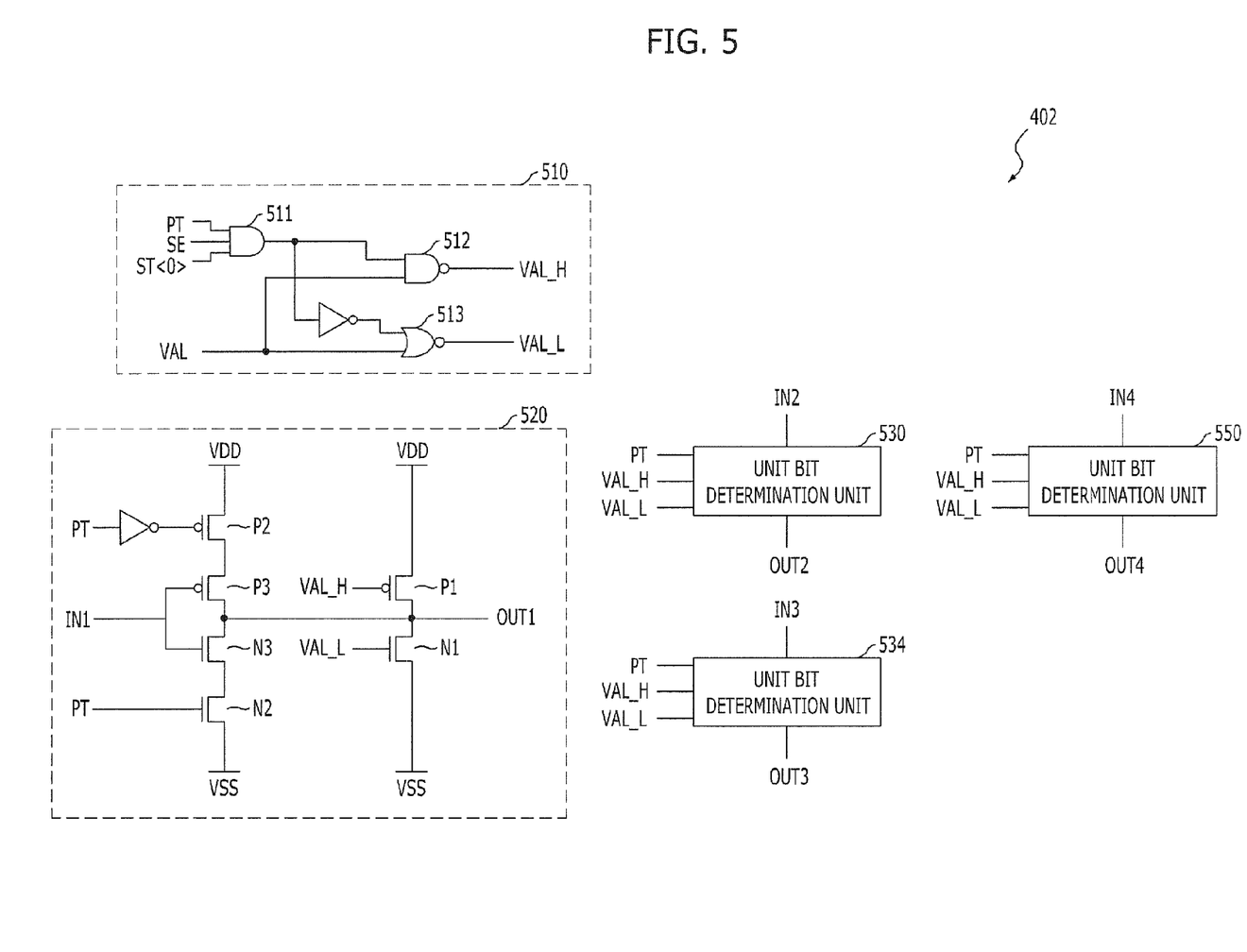
FIG. 5 is a configuration diagram of a locking circuit of FIG. 4.

FIG. 5 is a configuration diagram of the locking circuit 402 of FIG. 4.

As illustrated in FIG. 5, the locking circuit 402 includes a locking value determination unit 510 and a plurality of unit bit determination units 520 to 550. In FIG. 5, IN1 is a value obtained by inverting data of one of A1 lines, and OUT1 is data provided to one of S1 lines. One bit of output data of the first cell array 310 is inputted to the IN1.

The locking value determination unit 510 includes a plurality of logic gates 511, 512 and 513. When the first test signal PT, the second test signal SE, and the locking signal ST<0> are activated, values of VAL_H and VAL_L are changed depending on a value of VAL. When one or more of the first test signal PT, the second test signal SE and the locking signal ST<0> is not activated, VAL_H='1' (P1 is turned on) and VAL_L='0' (N1 is turned off), regardless of the value of VAL.

The unit bit determination unit 520 includes a plurality of transistors N1 to N3 and P1 to P3. The unit bit determination unit 520 inverts data of IN1 depending on values of the first test signal PT, VAL_H, and VAL_L, and the unit bit determination unit 520 provides the inverted data to OUT1, or locks the value of OUT1 as a specific value.

When the first test signal PT, the second test signal SE, and the locking signal ST<0> are activated, the data provided to OUT1 is locked as '1' when VAL is '1' (since VAL_H='0', the P1 is turned on, and since VAL_L='0', the N1 is turned off). When VAL is '0' (since VAL_H='1', the P1 is turned off, and since VAL_L='1', the N1 is turned on), the data provided to OUT1 is locked as '0' (where the data provided to OUT is locked as '1' has been described in FIGS. 1 to 4).

The configurations and operations of the plurality of unit bit determination units 520 to 550 are identical to those of the unit bit determination unit 520 illustrated in FIG. 5, except inputs of the plurality of unit bit determination units 520 to 550. The configurations and operations of the other locking circuits 403 to 405 are identical to those of the locking circuit 402, except locking signals S<1> to S<3> inputted to the other locking circuits 403 to 405.

Figure 6:
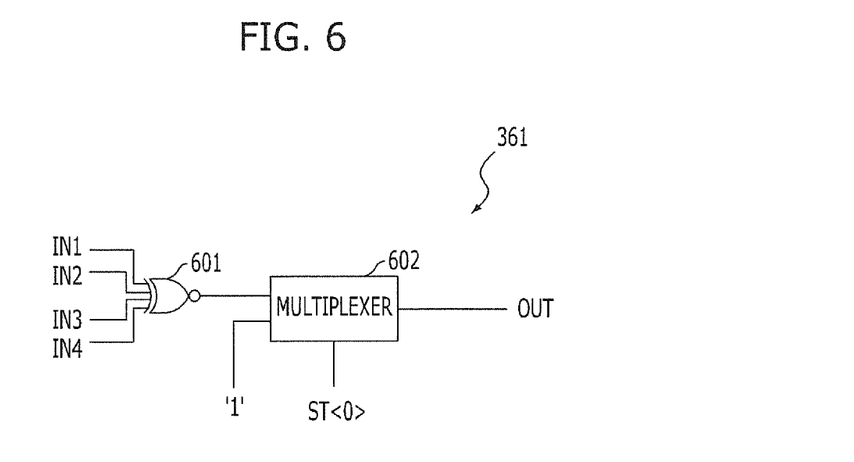
FIG. 6 is a configuration diagram of a compression unit.

FIG. 6 is a configuration diagram of the compression unit 361 of FIG. 3b.

As illustrated in FIG. 6, the compression unit 361 includes a four-input exclusive NOR gate 601 and a multiplexer 602.

Four input signals IN1 to IN4 of the exclusive NOR gate 601 correspond to data of lines of the lines A1, respectively. The output signal OUT of the multiplexer 602 is an output of the compression unit 361, which corresponds to intermediate data described in FIG. 3b.

When the locking signal ST<0> is activated, the multiplexer 602 outputs '1' as the output signal OUT. When the locking signal ST<0> is not activated, the multiplexer 602 outputs an output of the exclusive NOR gate 601 as the output signal OUT.

In the test method for a memory according to the present invention, a compression test is performed by locking data outputted in the other array cells except a cell array specified among a plurality of cell arrays as normal data, so that when the plurality of cell arrays have a fail, it is possible to check which cell array among the plurality of cell arrays has the fail.

While the present invention has been described with respect to the specific embodiments, it will be apparent to those skilled in the art that various changes and modifications may be made without departing from the spirit and scope of the invention as defined in the following claims.

What is claimed is:

1. A test method for a memory having first and second cell arrays, comprising:
    outputting first compressed data obtained by compressing output data of the first cell array and output data of the second cell array; and
    locking one of the output data of the first cell array and the output data of the second cell array as normal data and outputting second compressed data obtained by compressing the normal data and the other of the output data of the first cell array and the output data of the second cell array, when the first compressed data represents that a fail exists.

2. The test method of claim 1, wherein when the output data of the first cell array is locked as the normal data in the outputting of the second compressed data, the second cell array has a fail when the second compressed data represents that the fail exists.

3. The test method of claim 1, wherein when the output data of the second cell array is locked as the normal data in the outputting of the second compressed data, the first cell array has a fail when the second compressed data represents that the fail exists.

4. The test method of claim 1, wherein when the first compressed data represents that no fail exists, the test method ends without outputting the second compressed data.

5. A test method for a memory having a plurality of cell array, comprising:
   outputting first compressed data obtained by compressing output data of the plurality of cell arrays; and
   locking output data of remaining cell arrays in the plurality of cell arrays as normal data and outputting second compressed data obtained by compressing the normal data and output data of a target cell array, when the first compressed data represents that a fail exists,
   wherein the plurality of cell arrays include the target cell array and the remaining cell arrays.

6. The test method of claim 5, wherein the locking of output data of remaining cell arrays and the outputting of the second compressed data is repeated until each of the plurality of cell arrays is specified as the target cell array at least once.

7. The test method of claim 6, wherein when the second compressed data represents that a fail exists, the at least one array cell specified as the target cell array among the plurality of cell arrays has the fail.

8. The test method of claim 5, wherein when the first compressed data represent that no fail exists, the test method ends without outputting the second compressed data.

9. A memory comprising:
   a plurality of cell arrays;
   a data compression unit configured to generate a compressed data by compressing output data of the plurality of cell arrays in a compression test; and
   a data locking unit configured to lock output data of remaining cell arrays in the plurality of cell arrays as normal data,
   wherein the plurality of cell arrays include a target cell array and the remaining cell arrays.

10. The memory of claim 9, wherein when the compressed data represents that no fail exists in the state when the target cell array is not specified, all the cell arrays have no fail, and when the compressed data represent that a fail exists in the state that target cell array is not specified, the at least one cell array among the plurality of cell arrays has the fail.

11. The memory of claim 9, wherein when the compressed data represents that a fail exists in the state that at least one cell among the plurality of cell arrays is specified as the target cell array, the at least one cell array specified as the target cell array has the fail, and when the compressed data represents that no fail exists in the state that at least one cell among the plurality of cell arrays is specified as the target cell array, the at least one cell array specified as the target cell array has no fail.

* * * * *